United States Patent [19]

Maddox, III et al.

[11] Patent Number: 5,278,085
[45] Date of Patent: Jan. 11, 1994

[54] SINGLE MASK PROCESS FOR FORMING BOTH N-TYPE AND P-TYPE GATES IN A POLYCRYSTALLINE SILICON LAYER DURING THE FORMATION OF A SEMICONDUCTOR DEVICE

[75] Inventors: Roy L. Maddox, III; Viju K. Mathews; Pierre C. Fazan, all of Boise, Id.

[73] Assignee: Micron Semiconductor, Inc., Boise, Id.

[21] Appl. No.: 928,928

[22] Filed: Aug. 11, 1992

[51] Int. Cl.$^5$ .......................................... H01L 21/266
[52] U.S. Cl. ....................................... 437/34; 437/46; 437/983; 148/DIG. 103
[58] Field of Search ........................ 437/34, 46, 57, 70, 437/74, 63, 64, 150, 940, 952, 955, 983; 148/DIG.38, 36, 70, 103, 112, 114, 117

[56] References Cited

U.S. PATENT DOCUMENTS 4,420,344 12/1983 Davies et al. .......................... 437/46
4,966,866 10/1990 Mikata et al. ......................... 437/34
5,021,354 6/1991 Pfiester ................................. 437/34

*Primary Examiner*—Brian E. Hearn
*Assistant Examiner*—C. Chaudhari
*Attorney, Agent, or Firm*—Stanley N. Protigal

[57] ABSTRACT

Described is a process used during the formation of a semiconductor device to produce a doped layer of polycrystalline silicon having a pair of conductivity types using a single mask step. In a first embodiment, a patterned nonoxidizing layer is formed over the layer of polycrystalline silicon thereby leaving protected and exposed poly. The exposed polycrystalline silicon is doped, then oxidized, with the protected poly being free of oxidation. The nonoxidizing layer is stripped, and a blanket implant is performed. The oxidation prevents the previously doped polycrystalline silicon from being counterdoped. The oxidation is then stripped and wafer processing continues. In a second embodiment, a layer of resist is formed over the polycrystalline silicon layer, and the exposed poly is heavily doped with a material having a first conductivity type. The resist is removed, and the surface is blanket doped with a material having a second conductivity type. The second conductivity type is chosen so as to have minimal counterdoping effect of the previously doped polycrystalline silicon. Wafer processing continues.

22 Claims, 4 Drawing Sheets

SINGLE MASK PROCESS FOR FORMING BOTH N-TYPE AND P-TYPE GATES IN A POLYCRYSTALLINE SILICON LAYER DURING THE FORMATION OF A SEMICONDUCTOR DEVICE

FIELD OF THE INVENTION

This invention relates to the field of semiconductor manufacture. More specifically, a fabrication process is described which allows for the formation of a both N-type and P-type structures in a polycrystalline silicon layer using a single mask process.

BACKGROUND OF THE INVENTION

An electronic circuit is chemically and physically integrated into a substrate such as a silicon wafer by patterning regions in the substrate, and by patterning layers on the substrate. These regions and layers can be conductive, for conductor and resistor fabrication, or insulative, for insulator and capacitor fabrication. They can also be of differing conductivity types, for example p-type and n-type, which is essential for transistor and diode fabrication. Degrees of resistance, capacitance, and conductivity are controllable, as are the physical dimensions and locations of the patterned regions and layers, making circuit integration possible. Fabrication can be quite complex and time consuming, and therefore expensive. It is thus a continuing goal of those in the semiconductor fabrication business to reduce fabrication times and costs of such devices in order to increase profits. Any simplified processing step or combination of processes at a single step becomes a competitive advantage.

A situation where a process simplification is desirable is in the formation of structures in polycrystalline silicon having differing conductivity types. Polycrystalline silicon is resistive in nature, but is made less resistive when doped with an element having less or more than four valence electrons (depending on the conductivity type), or when layered with conductive silicide. In this disclosure, "n-type" denotes silicon that has been doped with atoms having more than four valence electrons (group V or higher), such as arsenic or phosphorus, which introduce negatively charged majority carriers into the silicon, and "p-type" denotes silicon doped with atoms having less than four valence electrons (group III or lower), such as boron, which introduce positively charged majority carriers. The majority charge carrier type is also referred to as conductivity type. "Poly" and "polysilicon" denote polycrystalline silicon. By photomasking, geometries on the order of a micron or less are obtainable for device elements in the IC.

As devices are scaled down below 0.5 microns ($\mu$m), some of the conventional technology becomes less useful. In particular, the gate structure of a conventional memory device, for example, is a concern below 0.35 $\mu$m. N+ polysilicon is currently the most widely used material for both n- and p-channel device gates, but when applied to sub-halfmicron devices it can contribute to serious short channel effects found in buried p-channel devices. One method to limit these short channel effects is to use a halo implant, which has the disadvantage of limiting the minimum channel length attainable at approximately the sub-halfmicron boundary. A method with fewer shortcomings is to use dual polysilicon gate materials, for example n+ poly for the n-channel gates and p+ poly for the p-channel gates.

FIGS. 1a–1c show a conventional process for doping a polycrystalline silicon layer with two different materials, for example boron to produce p-type areas and phosphorous to produce n-type areas. In FIG. 1A, a substrate 10 having doped wells of p-type 12 and n-type 14 material is layered with an insulation layer 16, for example oxide to form a gate oxide layer, and an undoped poly layer 18. A photoresist layer 20 is patterned onto the surface over the p-wells to prevent doping, while areas of poly over the n-wells are left exposed. The exposed poly is doped with the boron to form p-type poly 18A over the n-wells 14, the photoresist 20 is stripped, and a second photoresist layer 22 is masked onto the poly areas over the p-type poly as shown in FIG. 1B. The exposed poly is doped with phosphorous to form n-type poly 18B and the photoresist 22 is stripped to form the structure of FIG. 1C. Wafer processing continues according to means known in the art.

The formation of this structure conventionally requires two mask steps. A process which formed the structure with a single mask step would be desirable, as additional mask steps are undesirable. For example, misalignment can easily occur, especially as device features decrease in size to below 0.5 $\mu$m.

SUMMARY OF THE INVENTION

An object of the invention is to provide a process for forming a layer of polycrystalline silicon having both p-type and n-type conductivity using a single mask step.

This and other objects of the invention are realized by first forming n- and p-wells in a semiconductor substrate, and forming layers of oxide (such as gate oxide) and polycrystalline silicon over the substrate. Next, a nonoxidizable dielectric such as Si$_3$N$_4$ is patterned on top of the polycrystalline silicon so as to cover the n-well in the substrate. The exposed poly is doped to an n-type conductivity, for example by implantation or by diffusion/deposition. The poly over the p-wells then becomes n-type. The n-type poly is then oxidized with the amount of oxidization controlled so as to leave a sufficient amount of n-type poly unoxidized over the p-wells. A poly thickness of 1,000 Å is known to be sufficient, although thicknesses, either thicker or thinner, are also possible. The poly over the n-wells is not oxidized due to the patterned nonoxidizing dielectric layer which was deposited earlier in the process as described above. The remaining nonoxidizing dielectric patterned layer is now removed without removing any significant amount of oxide or poly. The poly over the n-wells is then doped to a p-type conductivity by ion implantation or by diffusion/deposition.

DETAILED DESCRIPTION OF THE INVENTION

Figure 1A:
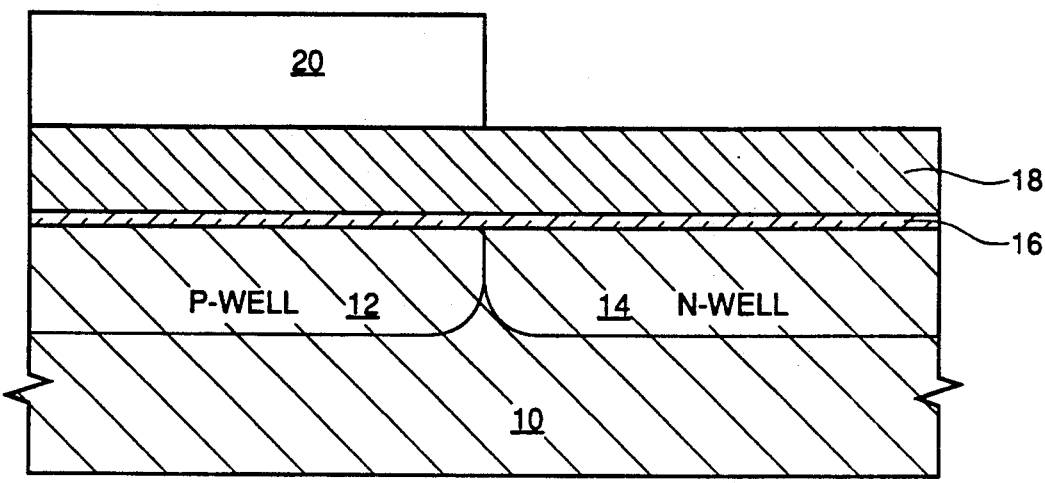
FIGS. 1A–1C describe a conventional method of forming a poly structure having a pair of conductivity types.
Figure 1B:
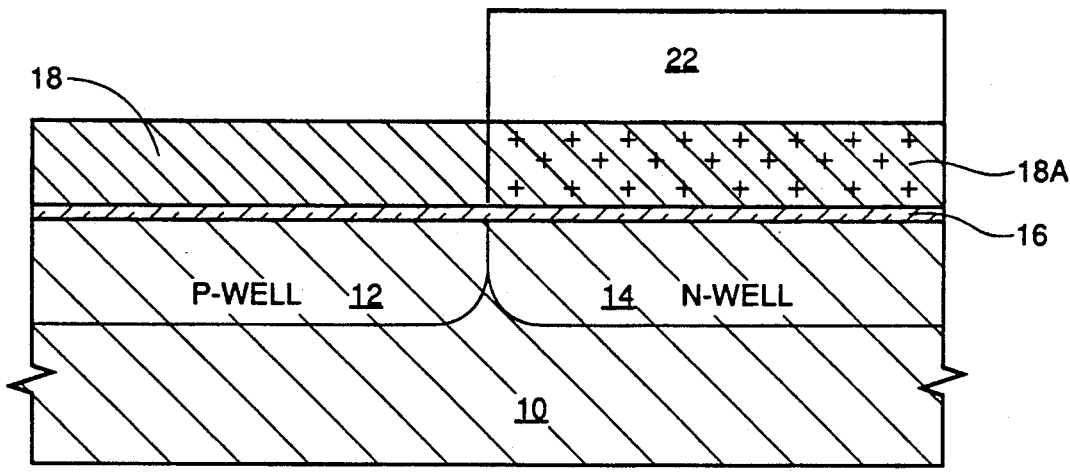
Figure 1C:
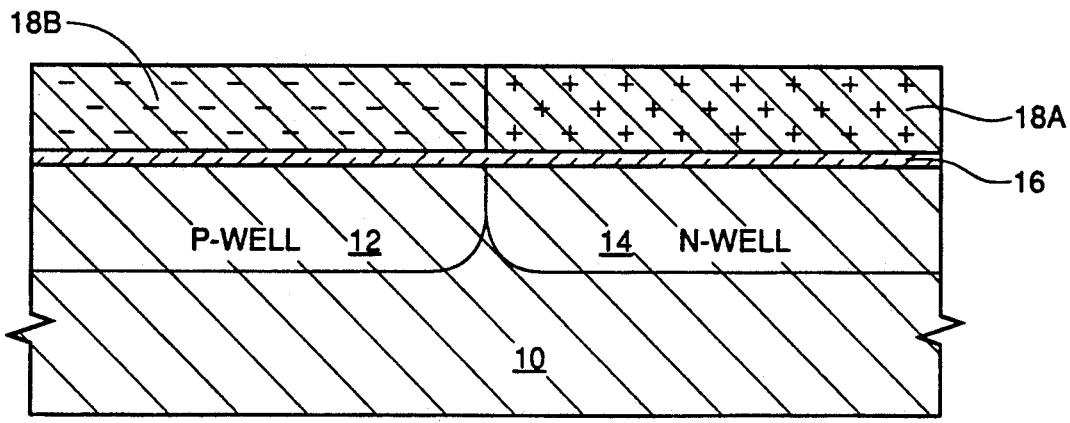
Figure 2A:
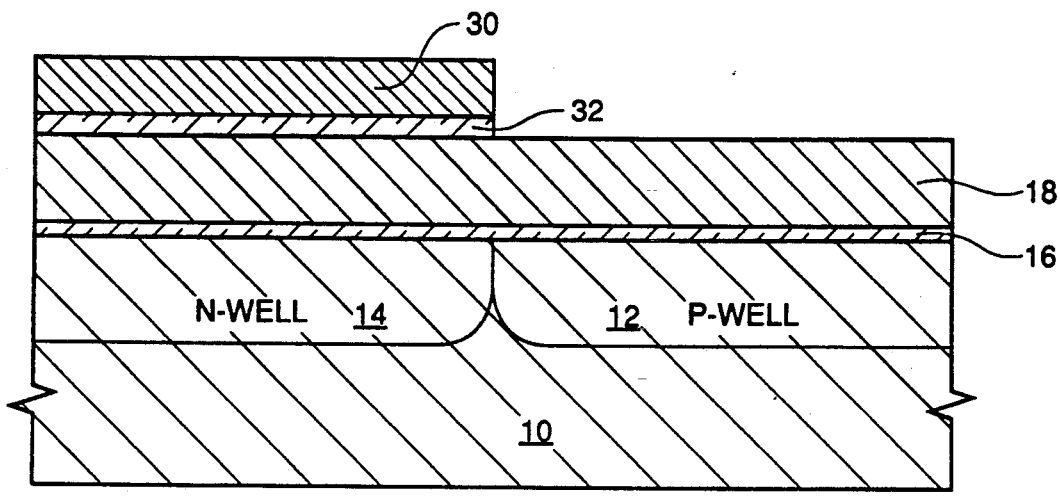
FIGS. 2A–2E describe a first embodiment of the inventive method of forming a poly structure having a pair of conductivity types which requires one less mask step than conventional methods.

The description below is described with reference to forming a memory device such as a dynamic random access memory, although the process could be useful in the formation of other types of semiconductors. In accordance with the invention, a substrate 10, for example of silicon or gallium arsenide, is doped to form p-wells 12 and n-wells 14 as shown in FIG. 2A. A layer of thin dielectric 16 of an insulative material such as oxide is deposited to form a gate dielectric layer. A layer of polycrystalline silicon 18 is formed over the gate dielectric layer, and a nonoxidizing dielectric layer 30 is patterned over the poly 18. The patterning can be accomplished with a layer of photoresist (not shown) over a blanket layer of the nonoxidizing dielectric, with the exposed nonoxidizable dielectric being removed to form the structure of FIG. 2A.

The nonoxidizing dielectric 30 can be a layer of $Si_3N_4$, for example, about 500 Å, although other materials and thicknesses may be functional equivalents. The nonoxidizing layer 30 can be patterned by the use of a resist layer and a wet etch, or other patterning means may be possible. An optional pad oxide layer 32 is also shown in FIG. 2A, although this in not a requirement of the invention. The thicknesses of the layers depend on the characteristics of the device being manufactured, and would be easily determined by one of skill in the art.

Figure 2B:
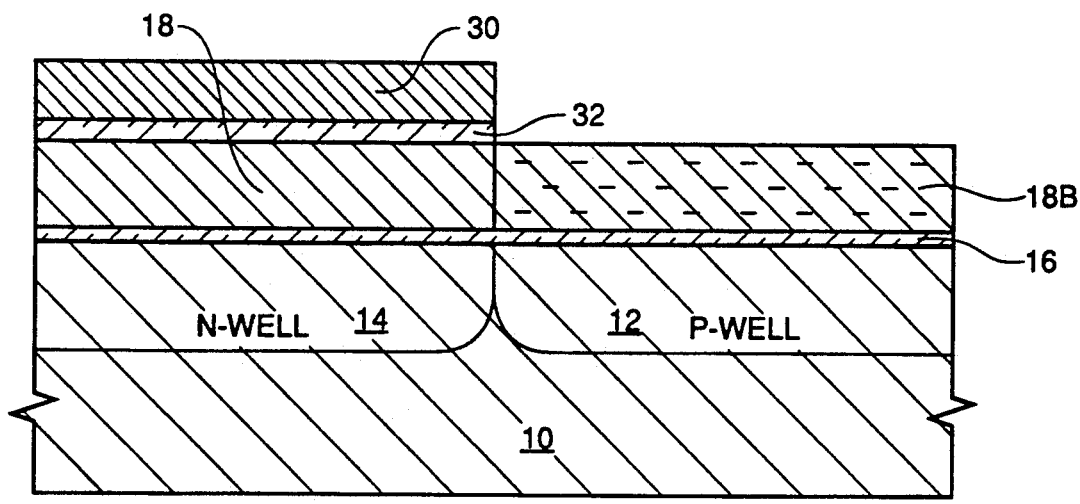
Figure 2C:
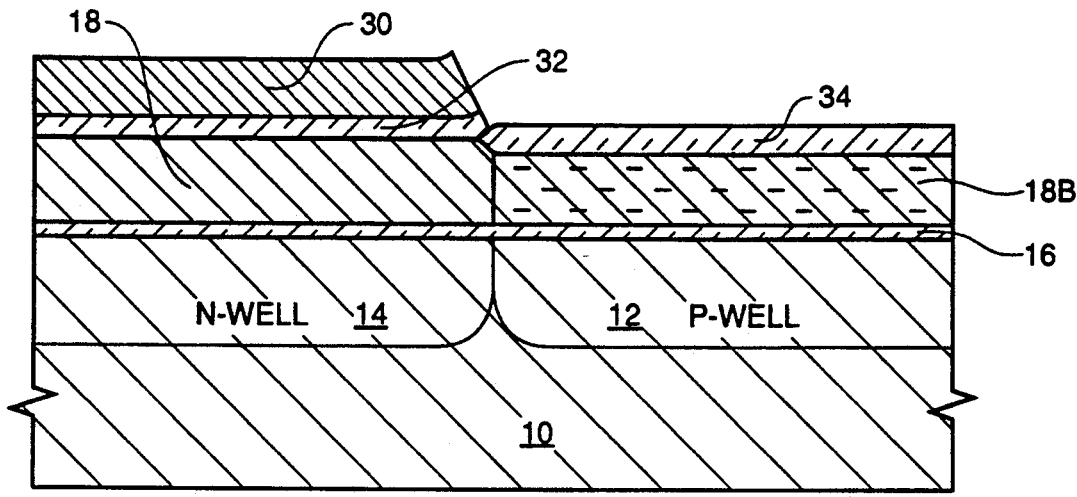

Next, the exposed poly layer 18 over the p-well 12 is doped, for example to form an n-type material 18B, which results the structure shown in FIG. 2B. The exposed n-type polycrystalline silicon 18B is oxidized according to means known in the art to form the oxidized poly structure 34 shown in FIG. 2C.

Figure 2D:
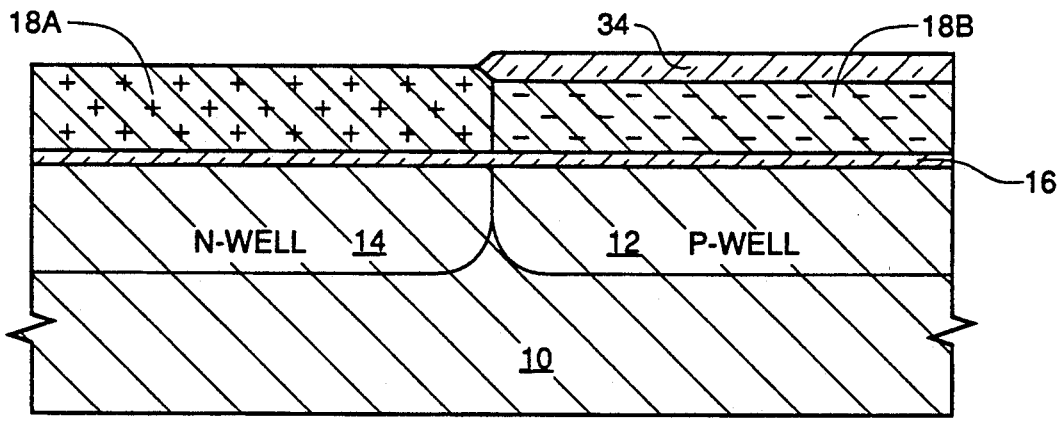

As shown in FIG. 2D, the nonoxidizing dielectric layer is stripped, for example with a wet oxide etch and a wet nitride strip, to expose the poly underneath. The wet oxide etch is too short to affect the thick oxidized poly 34. The surface of the structure is doped with a p-type dopant to form a p-type poly 18A over the n-well 14 as shown. The oxidized poly 34 protects the n-type poly 18B from counterdoping during this step.

Figure 2E:
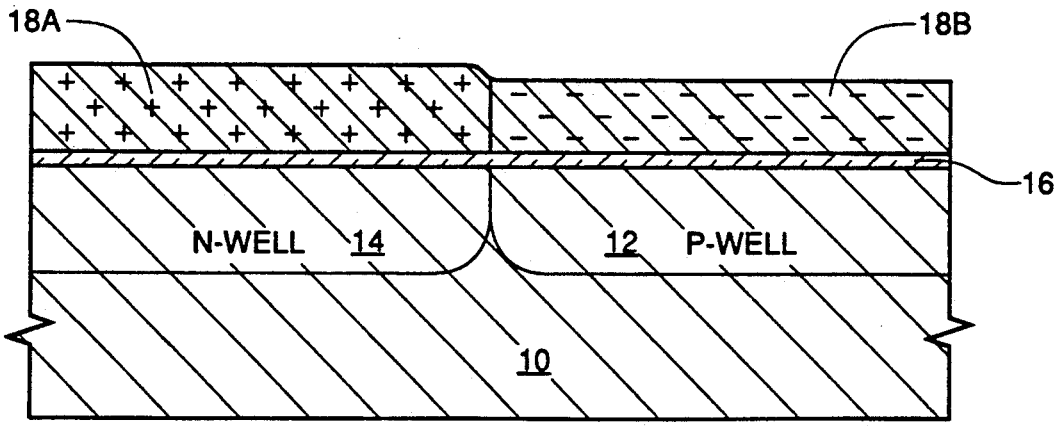

Finally, the oxidized poly 34 is stripped, for example with a wet oxide etch, thereby leaving the structure of FIG. 2E. Wafer processing continues by means known in the art to form the desired device.

The inventive process may not require the poly to be doped with the n-type material first. The nonoxidizing layer could possibly cover the poly over the p-well, with the p-type poly being doped first as a matter of choice, although this sequence was not attempted at during testing at Micron Technology, Inc.

Figure 3A:
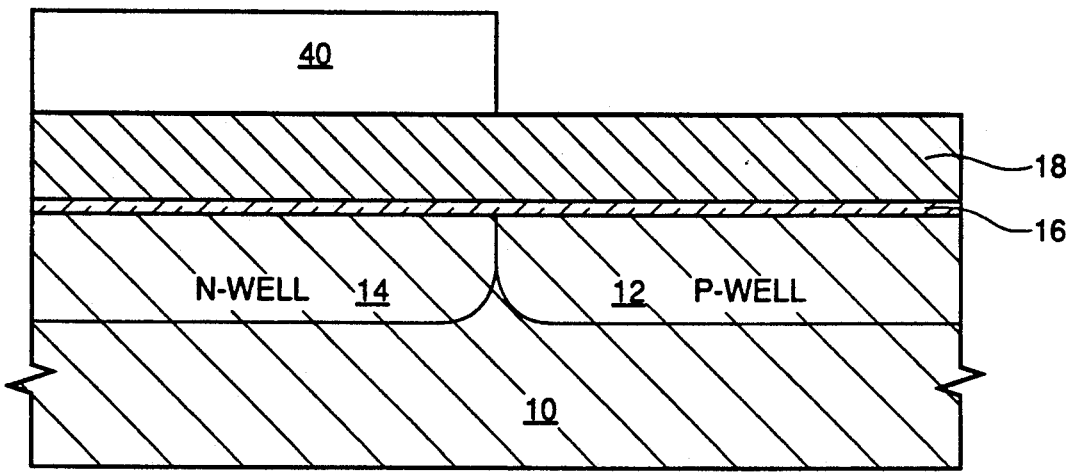
FIGS. 3A–3C describe a second embodiment of the inventive method of forming a poly structure having a pair of conductivity types which requires one less mask step than conventional methods.
Figure 3B:
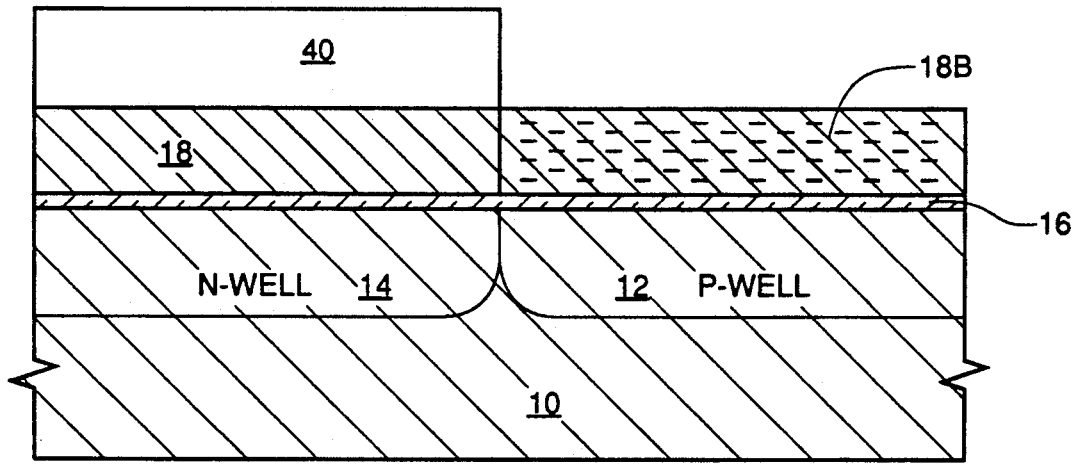
Figure 3C:
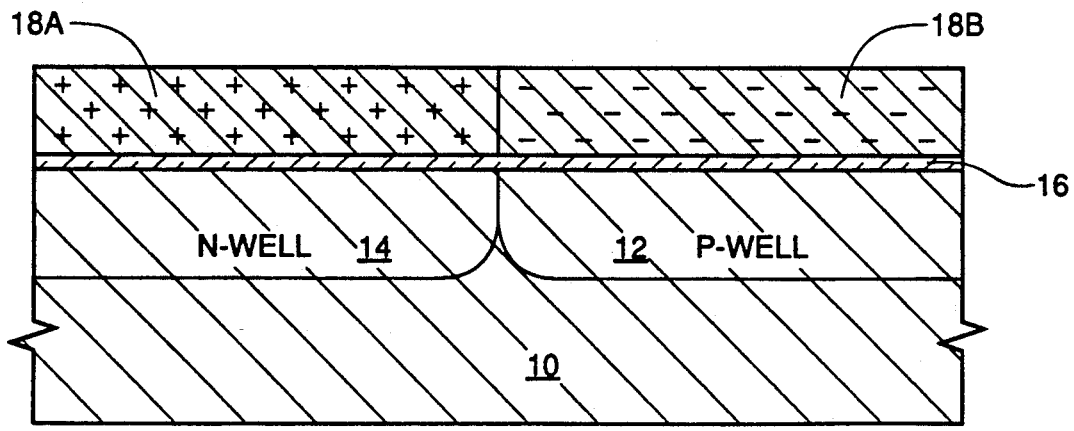

A second embodiment of the invention, shown in FIGS. 3A-3C, does not require the poly oxidation step. Instead after a resist 40 is masked onto the poly 18 over the n-well 14 as shown in FIG. 3A, the exposed poly is heavily doped with n-type material, for example arsenic or phosphorous to form a poly structure 18B having an n-type conductivity as shown in FIG. 3B. Next, the resist 40 is removed and a blanket implant of p-type material is performed, for example with boron or $BF_2$ to form a poly layer 18A having a p-type conductivity. The n-type poly 18B was doped heavily enough during the first doping step that it is not adversely counterdoped by the p-type dopant and retains adequate n-type characteristics.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

We claim:

1. A process for doping a layer of polycrystalline silicon with a pair of dopant materials to form a pair of gates during the formation of a semiconductor device, said process comprising the following steps:
   a) doping a first portion of a semiconductor substrate with a first material having a first type conductivity;
   b) doping a second portion of said substrate with a second material having a second type conductivity;
   c) forming a layer of dielectric over said substrate;
   d) forming a layer of polycrystalline silicon over said dielectric layer;
   e) forming a patterned nonoxidizing layer over a first portion of said polycrystalline silicon such that said nonoxidizing layer overlies said first portion of said substrate and leaving a second portion of said polycrystalline silicon exposed;
   f) doping said second portion of said polycrystalline silicon with a first material having said first type conductivity;
   g) oxidizing said exposed polycrystalline silicon to form an oxide layer over said second portion of said polycrystalline silicon and leaving said first portion of said polycrystalline silicon unoxidized;
   h) removing said nonoxidizing layer from said first portion of said polycrystalline silicon; and
   i) doping said unoxidized first portion of said polycrystalline silicon with a second material having said second type conductivity, whereby said oxide layer substantially prevents doping of said second portion of said polycrystalline silicon during step i).

2. The process of claim 1 wherein said first type conductivity is n-type and said second type conductivity is p-type.

3. The process of claim 1 wherein said first type conductivity is p-type and said second type conductivity is n-type.

4. The process of claim 1 wherein said nonoxidizing layer comprises $Si_3N_4$.

5. The process of claim 1 wherein said nonoxidizing layer is about 500 Å thick.

6. The process of claim 1 further comprising the step of removing said oxide layer.

7. The process of claim 6 wherein said oxide layer is removed with a wet etch.

8. The process of claim 1 wherein said first type conductivity comprises p-type and said first material comprises boron.

9. The process of claim 1 wherein said first type conductivity comprises n-type and said first material is selected from the group comprising arsenic and phosphorous.

10. A process for doping a layer of polycrystalline silicon with a pair of dopant materials to form a pair of gates during the formation of a semiconductor device, said process comprising the following steps:

a) doping a first portion of a semiconductor substrate with a first material having a first type conductivity;
b) doping a second portion of said substrate with a second material having a second type conductivity;
c) forming a layer of dielectric over said substrate;
d) forming a layer of polycrystalline silicon over said dielectric layer;
e) forming a patterned nonoxidizing layer over a first portion of said polycrystalline silicon such that said nonoxidizing layer overlies said first portion of said substrate and leaving a second portion of said polycrystalline silicon exposed;
f) doping said second portion of said polycrystalline silicon with a first material having said first type conductivity;
g) removing said nonoxidizing layer from said first portion of said polycrystalline silicon; and
h) doping said first portion of said polycrystalline silicon with a second material having said second type conductivity, whereby said first portion of said polycrystalline silicon forms a first gate and said second portion of said polycrystalline silicon forms a second gate.

11. The process of claim 10, further comprising the step of oxidizing said exposed polycrystalline silicon before step g) to form an oxide layer over said second portion of said polycrystalline silicon whereby said oxide layer substantially prevents doping of said second portion of said polycrystalline silicon during step h) and said first portion of said polycrystalline silicon remains substantially unoxidized during said step h).

12. The process of claim 11 wherein said nonoxidizing layer comprises $Si_3N_4$.

13. The process of claim 11 wherein said nonoxidizing layer is about 500 Å thick.

14. The process of claim 11 further comprising the step of removing said oxide layer.

15. The process of claim 11 wherein said oxide layer is removed with a wet etch.

16. The process of claim 10 wherein said first type conductivity is n-type and said second type conductivity is p-type.

17. The process of claim 10 wherein said first type conductivity is p-type and said second type conductivity is n-type.

18. The process of claim 10 wherein said first type conductivity comprises p-type and said first material comprises boron.

19. The process of claim 10 wherein said first type conductivity comprises n-type and said first material is selected from the group comprising arsenic and phosphorous.

20. The process of claim 10 wherein said step f) heavily dopes said second portion of said polycrystalline silicon with said material having said first type conductivity and said step h) lightly counterdopes said second portion of said polycrystalline silicon with said material having said second type conductivity with said second portion of said polycrystalline silicon substantially maintaining said first type conductivity thereby, said first and second portions of said polycrystalline silicon remaining substantially unoxidized at step h).

21. A process for doping a layer of polycrystalline silicon with a pair of dopant materials to form a pair of gates during the formation of a semiconductor device, said process comprising the following steps:
a) doping a first portion of a semiconductor substrate with a first material having a first type conductivity;
b) doping a second portion of said substrate with a second material having a second type conductivity;
c) forming a layer of dielectric over said substrate;
d) forming a layer of polycrystalline silicon over said dielectric layer;
e) forming a patterned nonoxidizing layer over a first portion of said polycrystalline silicon such that said nonoxidizing layer overlies said first portion of said substrate and leaving a second portion of said polycrystalline silicon exposed;
f) doping said second portion of said polycrystalline silicon to a first concentration with a first material having said first type conductivity;
g) removing said nonoxidizing layer from said first portion of said polycrystalline silicon; and
h) doping said first portion of said polycrystalline silicon to a second concentration with a second material having said second type conductivity, said second concentration being less than said first concentration such that said second portion of said polycrystalline silicon is lightly counterdoped with said second material, said second portion of said polycrystalline silicon substantially maintaining said first type conductivity thereby, said first and second portions of said polycrystalline silicon remaining substantially unoxidized at step h), whereby said first portion of said polycrystalline silicon forms a first gate and said second portion of said polycrystalline silicon forms a second gate.

22. The process of claim 10 wherein said first and second portions of said polycrystalline remain substantially unoxidized at step h), and wherein step h) simultaneously counterdopes said second portion of said polycrystalline silicon as said first portion of said polycrystalline silicon is being doped.

* * * * *